United States Patent
Vangal et al.

(10) Patent No.: US 6,865,134 B2
(45) Date of Patent: Mar. 8, 2005

(54) CHARGE RECYCLING DECODER, METHOD, AND SYSTEM

(75) Inventors: Sriram R. Vangal, Portland, OR (US); Nitin Y. Borkar, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/610,490

(22) Filed: Jun. 30, 2003

(65) Prior Publication Data

US 2004/0264281 A1 Dec. 30, 2004

(51) Int. Cl.7 .................................................. G11C 7/00
(52) U.S. Cl. ................................ 365/230.06; 365/191
(58) Field of Search ............................ 365/230.06, 191; 340/347

(56) References Cited

U.S. PATENT DOCUMENTS 4,468,653 A * 8/1984 Kapral ....................... 341/150

OTHER PUBLICATIONS

Yang, Byung–Do, et al., "A Low–Power ROM using Charge Recycling and Charge Sharing", *ISSCC 2002*, Session 6, (2002), 3 pages.

* cited by examiner

*Primary Examiner*—M. Tran
(74) *Attorney, Agent, or Firm*—LeMoine Patent Services; Dana B. LeMoine (57) ABSTRACT

A charge recycling decoder shares charge between output nodes when input nodes change state.

28 Claims, 7 Drawing Sheets

CHARGE RECYCLING DECODER, METHOD, AND SYSTEM

FIELD

The present invention relates generally to decoder circuits, and more specifically to decoder circuits to drive capacitive loads.

BACKGROUND

Decoder circuits typically drive capacitive loads. When the capacitive loads are large, power consumption may increase because more current is consumed each time a capacitive load is charged.

DESCRIPTION OF EMBODIMENTS

In the following detailed description, reference is made to the accompanying drawings that show, by way of illustration, various embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Figure 1:
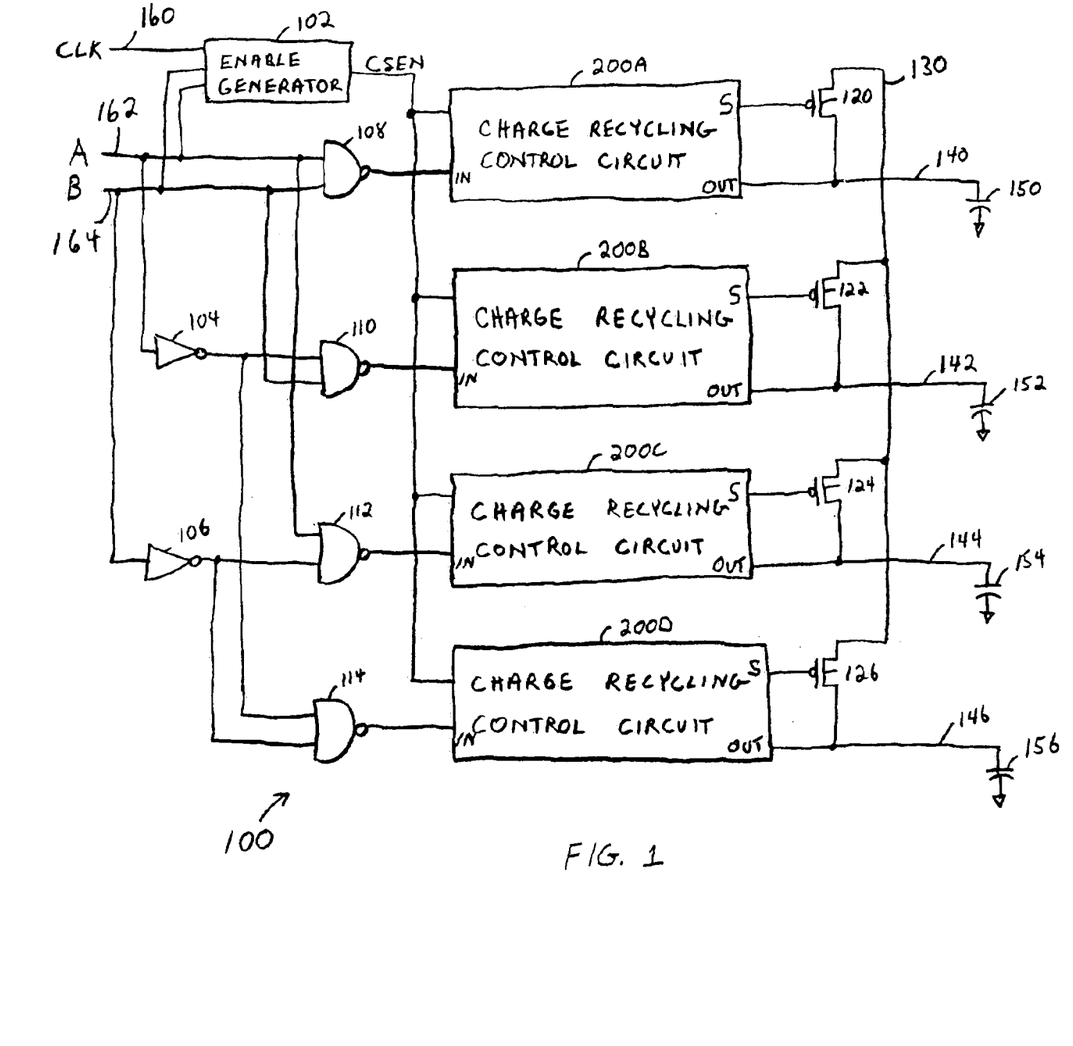
FIG. 1 shows a block diagram of charge recycling decoder.

FIG. 1 shows a block diagram of a charge recycling decoder. Charge recycling decoder 100 includes enable generator 102, logic gates 108, 110, 112, 114, inverters 104 and 106, charge recycling control circuits 200A, 200B, 200C, and 200D, and transistors 120, 122, 124, and 126.

Charge recycling decoder 100 receives a clock signal (CLK) on node 160 and two address bits (A and B) on nodes 162 and 164, and conditionally drives output signals on decoder output nodes 140, 142, 144, and 146. Inverters 104 and 106, and logic gates 108, 110, 112, and 114 decode the four possible states of the address bits A and B, and produce decoded address signals. Capacitive loads 150, 152, 154, and 156 shown coupled to the decoder output nodes may not be part of the decoder circuit. For example, capacitive load 150 may be formed by input nodes of circuit elements driven by decoder output node 140.

Charge recycling control circuits receive a decoded address signal at the input port labeled "IN" and conditionally drive a capacitive load at the output port labeled "OUT." For example, charge recycling control circuit 200A receives a decoded address signal from logic gate 108 and conditionally drives decoder output node 140.

Charge recycling control circuits also have a "sharing" output node labeled "S." For example, charge recycling control circuit 200A includes a sharing output node coupled to drive the gate of transistor 120. When a charge recycling control circuit asserts the S output low, the decoder output node driven by that charge recycling control circuit is coupled to charge sharing node 130. For example, when charge recycling control circuit 200A asserts the S output low, transistor 120 turns on, and decoder output node 140 is coupled to charge sharing node 130.

When two charge recycling control circuits assert their respective S outputs low, two decoder output nodes are coupled together via charge sharing node 130. For example, if both charge recycling control circuits 200A and 200B assert their respective S outputs low, transistors 120 and 122 turn on, and decoder output nodes 140 and 142 are both coupled to charge sharing node 130. When two decoder output nodes are coupled together in this manner, charge is shared between the two decoder output nodes. If one decoder output node is at a higher voltage than the other, charge will flow from the higher voltage to the lower voltage in the form of current. When a charge recycling control circuit asserts the S output low, the internal driver that conditionally drives the OUT node is tri-stated. This is explained in more detail with reference to FIG. 2.

In addition to receiving a decoded address signal, charge recycling control circuits receive a charge sharing enable signal (CS EN) produced by enable generator 102. Enable generator 102 is shown in more detail in FIG. 4.

Charge recycling decoder 100 is shown in FIG. 1 having two address inputs, A and B, and four decoder output nodes. In some embodiments, many more address bits are accepted as inputs, and many more decoder output nodes exist. For example, in some embodiments, three address bits are decoded, and eight output nodes are conditionally driven. In other embodiments, four address bits are decoded, and 16 output nodes are conditionally driven.

Charge recycling decoder 100 has many uses. For example, in some embodiments, charge recycling decoder 100 may be used as an address decoder in memory devices such as a read only memory (ROM), random access memory (RAM), caches, register files, and the like. Also for example, in some embodiments, charge recycling decoder 100 may be used in a logic application, such as an instruction decoder in a microprocessor, or the like.

Figure 2:
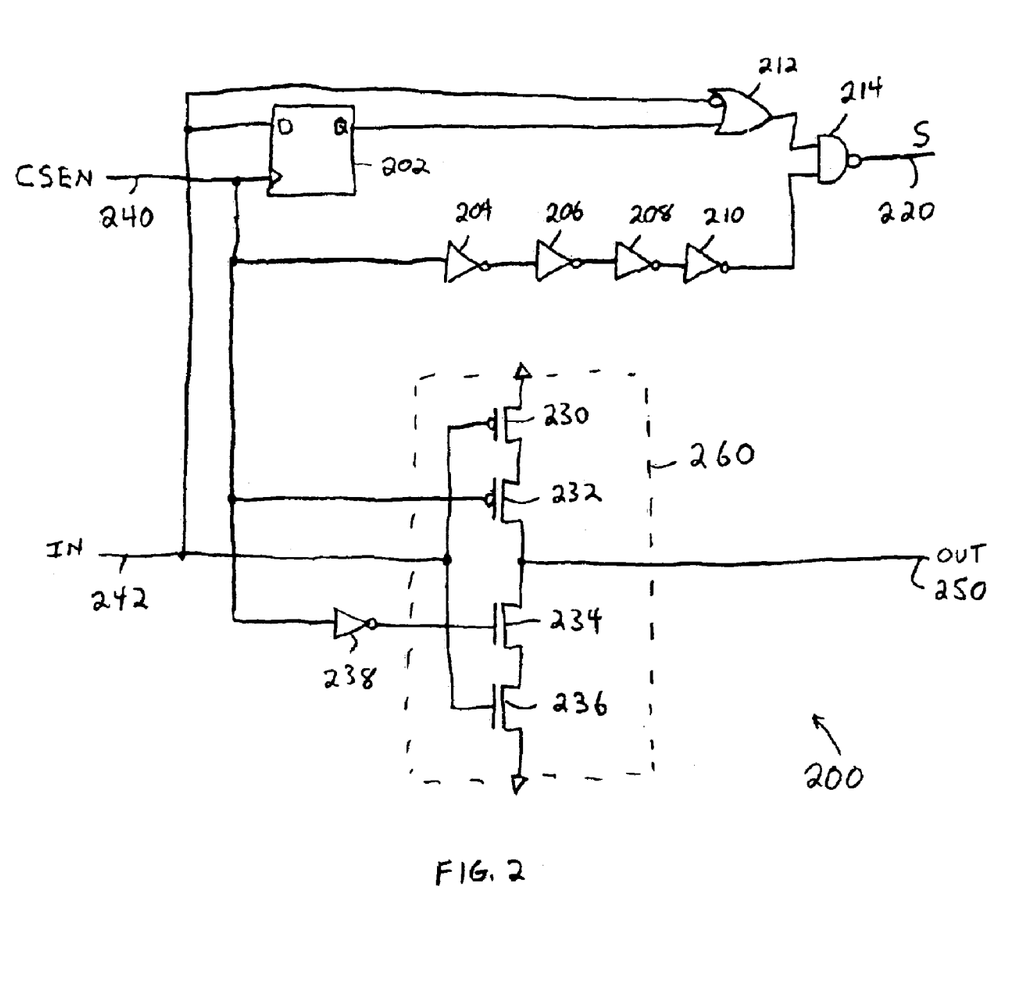
FIG. 2 shows a block diagram of a charge recycling control circuit.

FIG. 2 shows a block diagram of a charge recycling control circuit. Charge recycling control circuit 200 includes flip-flop 202, inverters 204, 206, 208, 210, and 238, logic gates 212 and 214, and tri-state driver 260. Tri-state driver 260 includes transistors 230, 232, 234, and 236. Charge recycling control circuit 200 receives the charge sharing enable (CSEN) signal on node 240, and a decoded address signal on node 242. Charge recycling control circuit 200 drives a sharing signal on node 220, and conditionally drives a capacitive load on node 250.

Within tri-state driver 260, transistors 230 and 236 form an inverter between input node 242 and output node 250.

Also within tri-state driver 260, transistors 232 and 234 are coupled in series with transistors 230 and 236. When transistors 232 and 234 are conducting, tri-state driver 260 operates as an inverting buffer, and when transistors 232 and 234 are pot conducting, tri-state driver 260 presents a high impedance to output node 250.

In operation, CSEN is asserted high only when the address has changed. This is explained further with respect to FIG. 4. When CSEN is asserted high, flip-flop 202 captures the previous state of the decoded address signal on node 242, and tri-state driver 260 presents a high impedance to output node 250. If, as a result of the address changing state, the input signal on node 242 changes, the sharing output signal on node 220 is asserted for a time substantially equal to the width of the CSEN signal. Inverters 204, 206, 208, and 210 form a delay circuit to provide glitch-free operation at output node 220.

When CSEN is deasserted low, the sharing output signal on node 220 is deasserted if it was asserted as a result of the input signal changing; and tri-state driver 260 turns on and drives output node 250. In some embodiments, charge recycling control circuit 200 may be used for each of charge recycling control circuits 200A, 200B, 200C, and 200D (FIG. 1). The timing diagrams shown in FIG. 3 are example waveforms produced when charge recycling control circuit 200 is used for the various charge recycling control circuits in FIG. 1.

The transistors shown in FIGS. 1 and 2 are shown as isolated gate transistors, and specifically as metal oxide semiconductor field effect transistors (MOSFETs). For example, transistors 120 and 230 are shown as P-type MOSFETs, and transistors 234 and 236 are shown as N-type MOSFETs. Other types of switching or amplifying elements may be utilized for the various transistors without departing from the scope of the present invention. For example, the transistors of charge recycling decoder 100 (FIG. 1) may be junction field effect transistors (JFETs), bipolar junction transistors (BJTs), or any device capable of performing as described herein.

Figure 3:
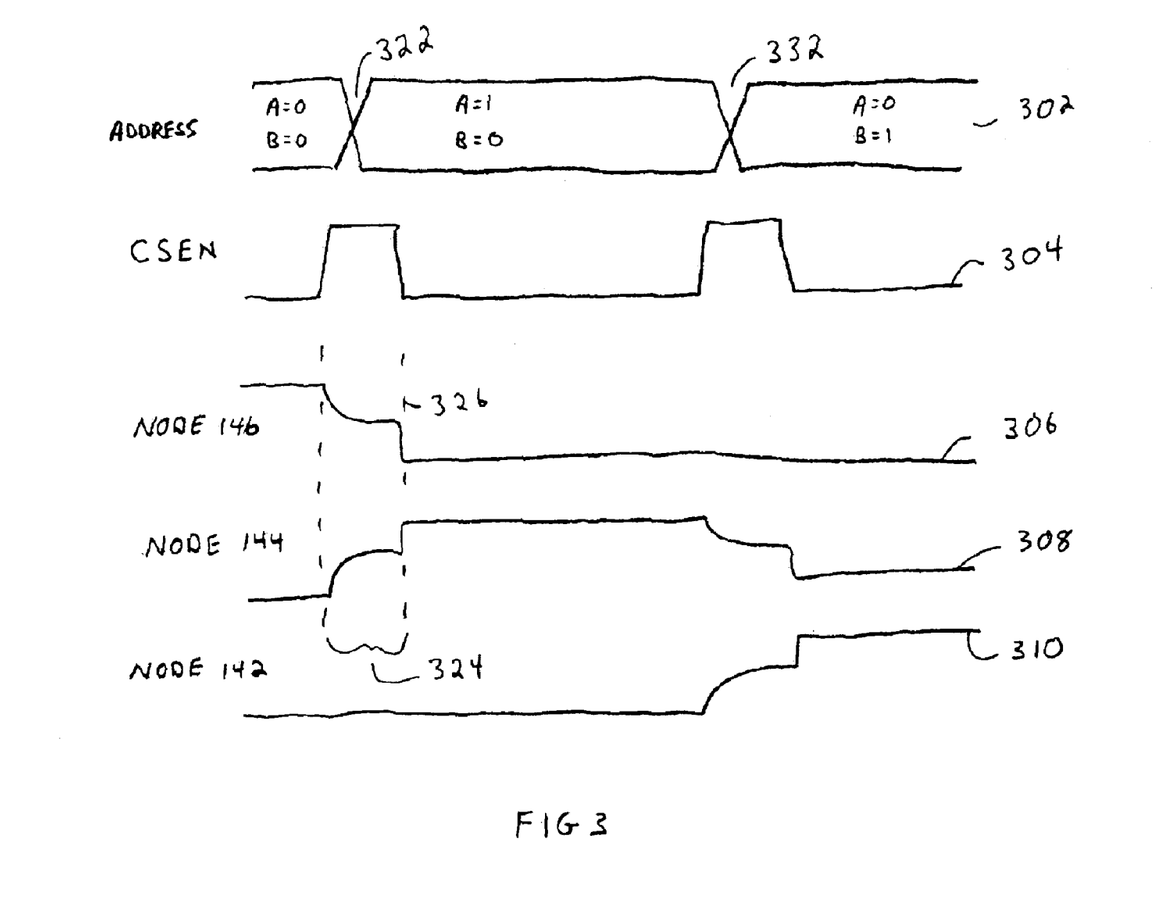
FIG. 3 shows a timing diagram in accordance with various embodiments of the present invention.

FIG. 3 shows a timing diagram in accordance with various embodiments of the present invention. The timing diagram of FIG. 3 includes waveforms 302, 304, 306, 308, and 310. Waveform 302 shows address bits A and B changing between three different states. Waveform 304 shows CSEN asserted twice, once for each transition of address bits A and B. Waveform 306 shows a voltage waveform of node 146 (FIG. 1), waveform 308 shows a voltage waveform of node 144 (FIG. 1), and waveform 310 shows a voltage waveform of node 142 (FIG. 1).

At the leftmost portion of waveform 302, address bits A and B are shown as A=0, B=0 (also referred to as "00"), and CSEN is deasserted. Accordingly, node 146 is at a static high level. This corresponds to charge recycling control circuit 200D (FIG. 1) receiving an asserted decoded address signal, and driving decoder output node 146 high. The other two decoder output nodes shown in FIG. 3 are low at this time.

Address bits A and B are shown changing from 00 to A=1, B=0 (also referred to as "10") at 322. CSEN is shown asserted during the change of address state from 00 to 10. As described above with reference to FIG. 2, the charge recycling decoder control circuits have tri-stated outputs during the assertion of CSEN. Charge recycling control circuits 200C and 200D each receive decoded address signals that change state at 322, and both assert their sharing (S) output signals during the assertion of CSEN, causing transistors 124 and 126 to turn on.

The resulting charge sharing is shown in FIG. 3 at 324. Charge from decoder output node 146 flows to, and partially charges, decoder output node 144. Some charge from the deselected output node 146 is "recycled" and used to partially charge the newly selected output node 144. After CSEN deasserts, the tri-state drivers inside the charge recycling decoder circuits turn on and drive the decoder output nodes to their final states. This is shown in FIG. 3 at 326.

A second address transition is shown at 332. The address transitions from 10 to 01, and charge is shared between decoder output node 144 and decoder output node 142.

Figure 4:
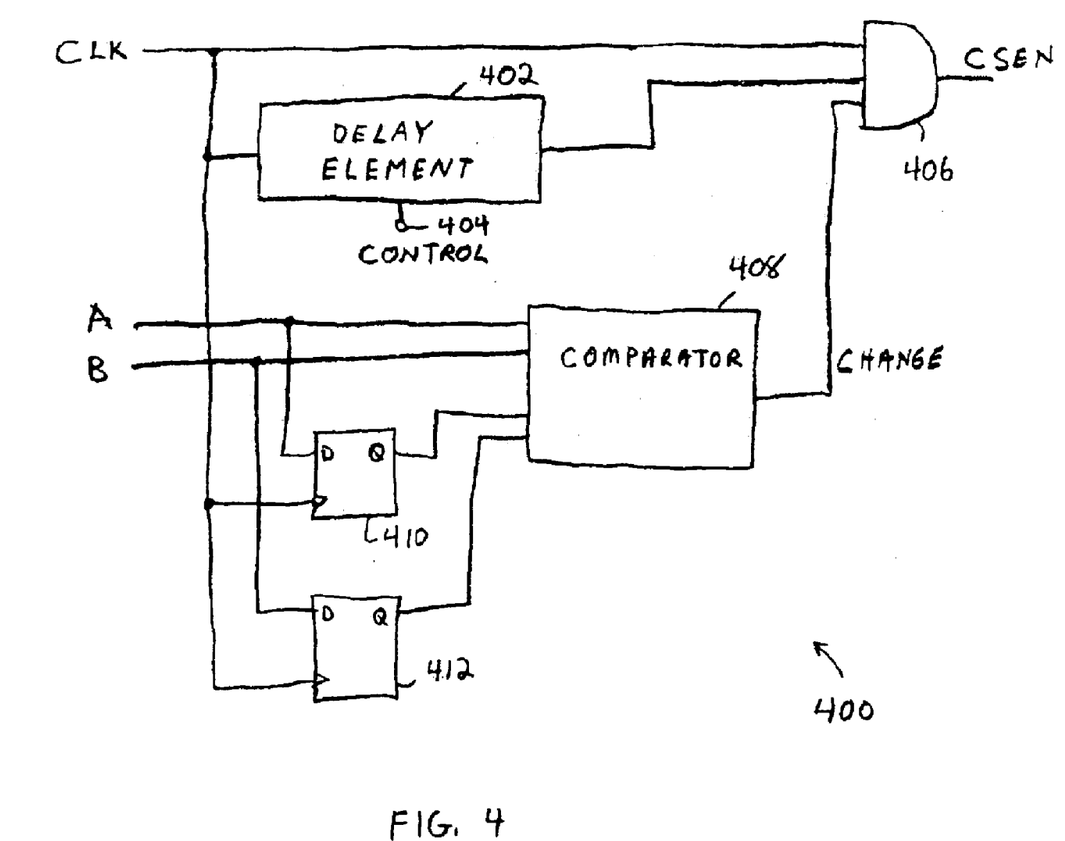
FIG. 4 shows a block diagram of an enable generator.

FIG. 4 shows a block diagram of an enable generator. Enable generator 400 includes flip-flops 410 and 412, delay element 402, comparator 408, and logic gate 406. In operation, enable generator 400 detects a change in the state of address bits A and B by comparing a previous state with a current state using comparator 408. Comparator 408 asserts the output signal (CHANGE) high when the address has changed. CSEN is asserted high once each clock period when the address has changed state. This is shown in the timing diagram of FIG. 5.

Delay element 402 provides a time delay between the CLK signal on the input and the output. The amount of delay provided by delay element 402 influences the width of the CSEN signal which is produced by logic gate 406.

In some embodiments, delay element 402 may be a programmable delay element adapted to provide a variable amount of delay. Control node 404 may be adapted to receive control information that changes the amount of delay provided by delay element 402. For example, in some embodiments, control node 404 may include multiple conductors to receive a digital signal to specify a delay value. In other embodiments, control node 404 may include multiple conductors to receive an analog signal to specify a delay value. Any type of programmable delay element may be utilized for delay element 402 without departing from the scope of the present invention. For example, a digitally controlled or analog controlled delay element may be used.

Delay control information may be provided to node 404 in many different ways. For example, a digital control value may be provided by a memory-mapped register, a serial scan chain, fusible links, or the like. Also for example, an analog control value may be provided by a programmable voltage reference, an external pin on an integrated circuit, or the like.

In some embodiments, control node 404 may be omitted, and delay element 402 may be a fixed delay element adapted to provide a fixed amount of delay. For example, an inverter chain may be utilized to provide a fixed delay between the CLK input and logic gate 406. Any type of fixed delay element may be utilized for delay element 402 without departing from the scope of the present invention.

Figure 5:
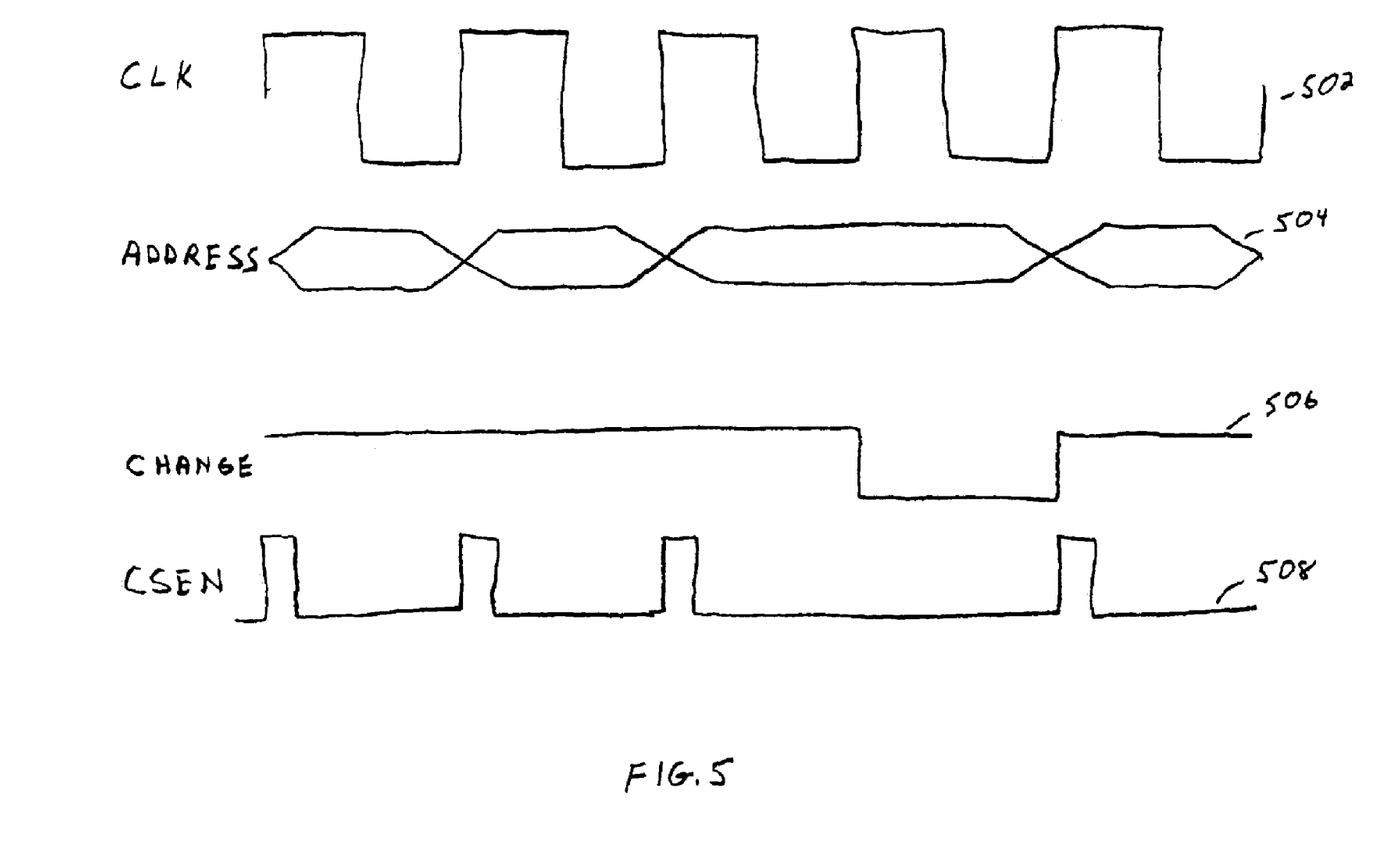
FIG. 5 shows a timing diagram in accordance with various embodiments of the present invention.

FIG. 5 shows a timing diagram in accordance with various embodiments of the present invention. The timing diagram of FIG. 5 includes waveforms 502, 504, 506, and 508. Waveform 502 shows a clock signal (CLK) corresponding to the clock signal received by enable generator 400 (FIG. 4), and waveform 504 shows the address changing between four different states. The address shown in FIG. 5 corresponds to the A and B address bits of FIG. 4. Waveform 506 shows the output of comparator 408 (FIG. 4), and waveform 508 shows the CSEN signal as generated by logic gate 406 (FIG. 4). As can be seen in FIG. 5, CHANGE is is high during clock periods after the address has changed state, and low during clock periods after the address has not changed state. CSEN is asserted four times, once for each clock period during which the CHANGE signal is asserted high.

Figure 6:
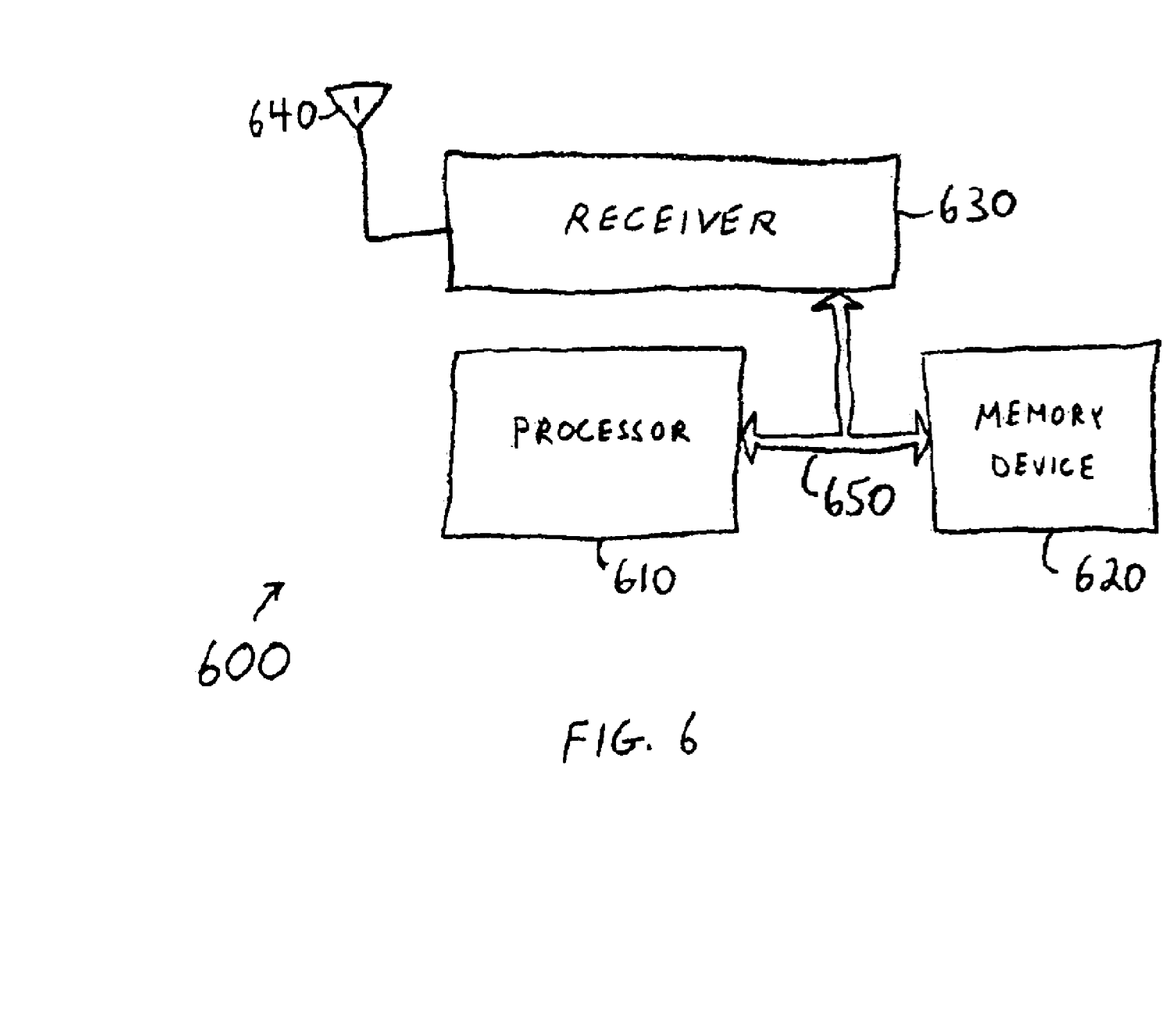
FIG. 6 shows a system diagram in accordance with various embodiments of the present invention.

FIG. 6 shows a system diagram in accordance with various embodiments of the present invention. Electronic system 600 includes processor 610, memory device 620, receiver 630, and antenna 640. Processor 610 may be any type of processor adapted to communicate with receiver 630 and memory device 620. For example, processor 610 may be a microprocessor, a digital signal processor, a microcontroller, or the like.

In systems represented by FIG. 6, processor 610 is coupled to receiver 630 and memory device 620 by bus 650. Receiver 630 is adapted to receive communications signals from antenna 640 and also communicates with processor 610 on bus 650. In some embodiments, receiver 630 provides communications data to processor 610. Also in some embodiments, processor 610 provides control information to direct conversion receiver 630 on bus 650. Receiver 630 may be a direct conversion receiver or "zero-IF" receiver that "down-converts" signals received from antenna 640 directly to baseband. In other embodiments, receiver 630 may be a heterodyne receiver that converts signals received from antenna 640 to frequencies other than baseband. For example, receiver 630 may be a superheterodyne receiver that converts the communications signals to an intermediate frequency, and then to baseband. The type or orientation of receiver 630 is not a limitation of the present invention.

Receiver 630 may be adapted to receive and demodulate signals of various formats and at various frequencies. For example, receiver 630 may be adapted to receive time domain multiple access (TDMA) signals, code domain multiple access (CDMA) signals, GSM signals, or any other type of communications signals. The present invention is not limited in this regard. For ease of illustration, frequency conversion and other signal processing is not shown in FIG. 6.

In some embodiments, system 600 includes a transceiver that both transmits and receives signals at antenna 640. For example, system 600 may be a cell phone with a transmitter and a receiver. Also for example, system 600 may be a wireless local area network interface that includes both a transmitter and a receiver.

Memory device 620 may be a memory device that includes a charge recycling decoder such as charge recycling decoder 100 (FIG. 1). For example, memory device 620 may include a charge recycling decoder to decode addresses for word lines or bit lines. In embodiments that include a programmable delay element such as delay element 402 (FIG. 4), processor 610 may set a control value by writing to a memory-mapped register, by controlling a scan chain, or the like.

Although processor 610 and memory device 620 are shown separate in FIG. 6, embodiments exist that combine the circuitry of processor 610 and memory device 620 in a single integrated circuit. For example, memory device 620 may be an internal memory within processor 610 or may be a microprogram control store within processor 610.

The type of interconnection between processor 610 and memory device 620 is not a limitation of the present invention. For example, bus 650 may be a serial interface, a test interface, a parallel interface, or any other type of interface capable of transferring command and status information between processor 610 and memory device 620.

Charge recycling decoders, charge recycling control circuits, enable generators, memory devices, and other embodiments of the present invention can be implemented in many ways. In some embodiments, they are implemented in integrated circuits. In some embodiments, design descriptions of the various embodiments of the present invention are included in libraries that enable designers to include them in custom or semi-custom designs. For example, any of the disclosed embodiments can be implemented in a synthesizable hardware design language, such as VHDL or Verilog, and distributed to designers for inclusion in standard cell designs, gate arrays, or the like. Likewise, any embodiment of the present invention can also be represented as a hard macro targeted to a specific manufacturing process. For example, charge recycling control circuit 200 (FIG. 2) may be represented as polygons assigned to layers of an integrated circuit.

Figure 7:
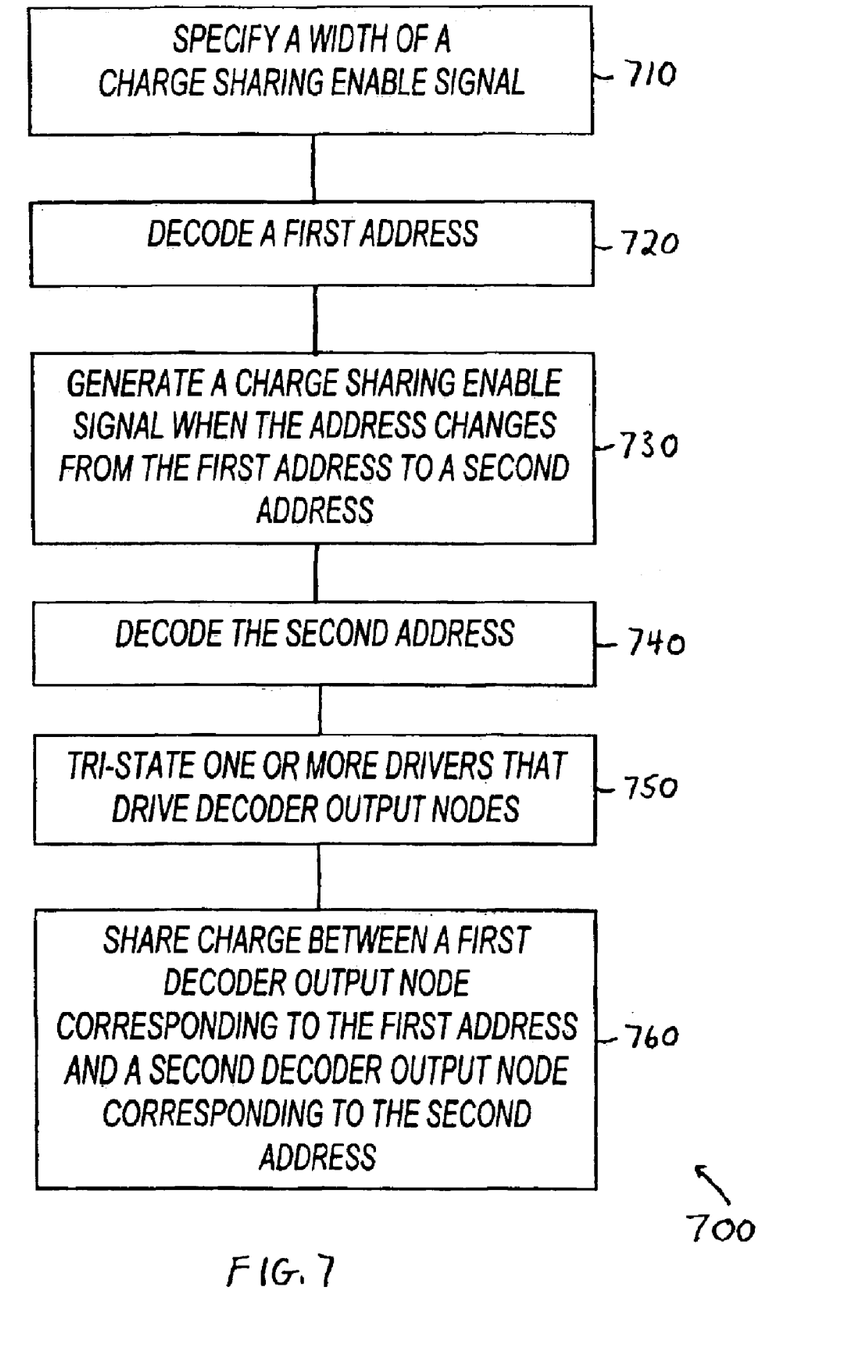
FIG. 7 shows a flowchart in accordance with various embodiments of the present invention.

FIG. 7 shows a flowchart in accordance with various embodiments of the present invention. In some embodiments, method 700, or portions thereof, is performed by a device external to a memory device or by an electronic system that includes a memory device. For example, method 700 may be performed by a charge recycling decoder such as charge recycling decoder 100 (FIG. 1) or by a memory device such as memory device 620 (FIG. 6). Also for example, method 700 may be performed by an electronic system such as a cellular phone or a wireless network interface. Method 700 is not limited by the particular type of apparatus or software element performing the method. The various actions in method 700 may be performed in the order presented, or may be performed in a different order. Further, in some embodiments, some actions listed in FIG. 7 are omitted from method 700.

Method 700 is shown beginning with block 710 in which a width of a charge sharing enable signal is specified. Actions of block 710 may correspond to setting a delay value for delay element 402 (FIG. 4). For example, a register may be programmed with a delay value to drive control node 404, or an analog voltage may be set to drive control node 404. Also for example, in embodiments represented by FIG. 6, processor 610 may write a delay value to a register that drives control node 404 (FIG. 4). In some embodiments of method 700, block 710 is omitted. For example, block 710 may be omitted if delay element 402 utilizes a fixed delay.

At 720, a first address is decoded. In some embodiments, this corresponds to one of logic gates 108, 110, 112, or 114 (FIG. 1) decoding the state of address bits A and B, and asserting a decoded address signal to one of the charge recycling control circuits.

At 730, a charge sharing enable signal is generated when the address changes from the first address to a second address. In some embodiments, the actions of 730 may correspond to charge sharing enable generator 102 (FIG. 1) detecting an address change and asserting the CSEN signal.

At 740, a second address is decoded. In some embodiments, this corresponds to one of logic gates 108, 110, 112, or 114 (FIG. 1) decoding the state of address bits A and B, and asserting a decoded address signal to one of the charge recycling control circuits.

At 750, one or more drivers that drive decoder output nodes are tri-stated. In some embodiments, this may correspond to charge recycling control circuits tri-stating output drivers in response to the CSEN signal.

At 760, charge is shared between a first decoder output node corresponding to the first address and a second decoder output node corresponding to the second address.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. A decoder circuit comprising:
   a plurality of output nodes;
   a charge sharing node;
   a charge sharing enable generator adapted to assert a charge sharing enable signal when an address changes;
   a plurality of switching devices coupled to be responsive to the charge sharing enable signal, wherein the plurality of switching devices are adapted to conditionally couple two of the plurality of output nodes to the charge sharing node concurrently; and
   a charge recycling control circuit coupled to receive the charge sharing enable signal and produce a control signal to control one of the plurality of switching devices.

2. The decoder circuit of claim 1 wherein the charge recycling control circuit includes a tri-state driver adapted to conditionally drive one of the plurality of output nodes.

3. The decoder circuit of claim 2 wherein the tri-state driver includes an inverter having two additional transistors adapted to be turned off at the same time.

4. The decoder circuit of claim 1 wherein the plurality of switching devices comprise PMOS transistors.

5. The decoder circuit of claim 1 wherein the plurality of switching devices consists of PMOS transistors.

6. A decoder circuit comprising:
   a plurality of output nodes;
   a charge sharing node;
   a charge sharing enable generator adapted to assert a charge sharing enable signal when an address changes; and
   a plurality of switching devices coupled to be responsive to the charge sharing enable signal, wherein the plurality of switching devices are adapted to conditionally couple two of the plurality of output nodes to the charge sharing node concurrently;
   wherein the charge sharing enable generator includes a programmable delay element to influence a width of the charge sharing enable signal.

7. The decoder circuit of claim 6 wherein the plurality of switching devices comprise PMOS transistors.

8. The decoder circuit of claim 6 wherein the plurality of switching devices consists of PMOS transistors.

9. A decoder circuit comprising:
   a plurality of output nodes;
   a charge sharing node;
   a charge sharing enable generator adapted to assert a charge sharing enable signal when an address changes; and
   a plurality of switching devices coupled to be responsive to the charge sharing enable signal, wherein the plurality of switching devices are adapted to conditionally couple two of the plurality of output nodes to the charge sharing node concurrently;
   wherein the charge sharing enable generator includes a fixed delay element to influence a width of the charge sharing enable signal.

10. The decoder circuit of claim 9 wherein the plurality of switching devices comprise PMOS transistors.

11. The decoder circuit of claim 9 wherein the plurality of switching devices consists of PMOS transistors.

12. A decoder circuit comprising:
    a charge sharing enable generator adapted to produce a charge sharing enable signal having a programmable width when an address changes;
    a first charge recycling control circuit coupled between the charge sharing enable generator and a first output node;
    a second charge recycling control circuit coupled between the charge sharing enable generator and a second output node;
    a first switching device responsive to the first charge recycling control circuit coupled between a charge sharing node and the first output node; and
    a second switching device responsive to the second charge recycling control circuit coupled between the charge sharing node and the second output node.

13. The decoder circuit of claim 12 wherein the charge sharing enable generator includes a state machine adapted to detect a change in the address.

14. The decoder circuit of claim 12 wherein the first charge recycling control circuit comprises a tri-state driver adapted to conditionally drive the first output node.

15. The decoder circuit of claim 14 wherein the tri-state driver comprises:
    two transistors coupled to form an inverter; and
    two transistors adapted to turn off when the first switching device is on.

16. The decoder circuit of claim 12 wherein the first charge recycling control circuit comprises a sequential element to detect whether the first output node will change state.

17. An electronic system comprising:
    a receiver adapted to receive communications signals;
    a processor coupled to the receiver; and
    a memory coupled to the processor, the memory having a decoder circuit that includes:
      a plurality of output nodes;
      a charge sharing node;
      a charge sharing enable generator adapted to assert a charge sharing enable signal when an address changes; and
      a plurality of switching devices responsive to the charge sharing enable signal,
    wherein the plurality of switching devices are adapted to conditionally couple two of the plurality of output nodes to the charge sharing node concurrently.

18. The electronic system of claim 17 wherein the decoder circuit further comprises a charge recycling control circuit coupled to receive the charge sharing enable signal and produce a control signal to control one of the plurality of switching devices.

19. The electronic system of claim 18 wherein the charge recycling control circuit includes a tri-state driver adapted to drive one of the plurality of output nodes.

20. The electronic system of claim 19 wherein the tri-state driver includes an inverter having two additional transistors adapted to be turned off at the same time.

21. The electronic system of claim 17 wherein the charge sharing enable generator includes a programmable delay element to influence a width of the charge sharing enable signal.

22. The electronic system of claim 17 wherein the charge sharing enable generator includes a fixed delay element to influence a width of the charge sharing enable signal.

23. A method comprising:

decoding a first address;

generating a charge sharing enable signal when the address changes from the first address to a second address;

decoding the second address; and sharing charge between a first decoder output node corresponding to the first address and a second decoder output node corresponding to the second address.

24. The method of claim 23 wherein generating a charge sharing enable signal comprises specifying a width of the charge sharing enable signal.

25. The method of claim 24 wherein specifying a width comprises setting a value of a programmable delay element.

26. The method of claim 23 wherein sharing charge comprises tri-stating a first output driver adapted to conditionally drive the first decoder output node.

27. The method of claim 26 wherein sharing charge further comprises tri-stating a second output driver adapted to conditionally drive the second decoder output node.

28. The method of claim 27 wherein sharing charge further comprises coupling the first and second decoder output nodes together.

* * * * *